(12) United States Patent
Boyd, Jr. et al.

(10) Patent No.: US 11,114,326 B2
(45) Date of Patent: Sep. 7, 2021

(54) SUBSTRATE CHUCKING AND DECHUCKING METHODS

(71) Applicant: Applied Materials, Inc., Santa Clara, CA (US)

(72) Inventors: Wendell Glenn Boyd, Jr., Morgan Hill, CA (US); Jim Zhongyi He, San Jose, CA (US); Ramesh Gopalan, Fremont, CA (US); Robert T. Hirahara, San Jose, CA (US); Govinda Raj, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 83 days.

(21) Appl. No.: 16/293,437

(22) Filed: Mar. 5, 2019

(65) Prior Publication Data

US 2019/0206712 A1 Jul. 4, 2019

Related U.S. Application Data

(63) Continuation-in-part of application No. 15/811,352, filed on Nov. 13, 2017, now abandoned.
(Continued)

(51) Int. Cl.
*H01L 21/683* (2006.01)
*H01J 37/32* (2006.01)

(52) U.S. Cl.
CPC .... *H01L 21/6831* (2013.01); *H01J 37/32449* (2013.01); *H01J 37/32715* (2013.01); *H01L 21/6833* (2013.01); *H01J 37/32091* (2013.01)

(58) Field of Classification Search
CPC .......... H01L 21/6833; H01L 21/67288; H01L 21/6831; C23C 14/50; C23C 14/541;
(Continued)

(56) References Cited

U.S. PATENT DOCUMENTS

| 5,637,973 | A | * | 6/1997 | Hirai | ..................... | B23Q 1/00 |
| | | | | | | 318/640 |
| 5,916,689 | A | | 6/1999 | Collins et al. | | |

(Continued)

FOREIGN PATENT DOCUMENTS

| JP | 200386664 A | 3/2003 |
| JP | 2004235478 A | 8/2004 |

(Continued)

OTHER PUBLICATIONS

PCT International Search Report and Written Opinion dated Dec. 4, 2018, for International Application No. PCT/US2018/047802.
(Continued)

*Primary Examiner* — Dah-Wei D. Yuan
*Assistant Examiner* — Nga Leung V Law
(74) *Attorney, Agent, or Firm* — Patterson + Sheridan, LLP

(57) ABSTRACT

Methods for chucking and de-chucking a substrate from an electrostatic chucking (ESC) substrate support to reduce scratches of the non-active surface of a substrate include simultaneously increasing a voltage applied to a chucking electrode embedded in the ESC substrate support and a backside gas pressure in a backside volume disposed between the substrate and the substrate support to chuck the substrate and reversing the process to de-chuck the substrate.

12 Claims, 7 Drawing Sheets

Related U.S. Application Data

(60) Provisional application No. 62/556,147, filed on Sep. 8, 2017.

(58) Field of Classification Search
CPC .... C23C 14/345; C23C 14/35; H01J 37/3249; H01J 37/32715; H01J 37/32091
See application file for complete search history.

(56) References Cited

U.S. PATENT DOCUMENTS

| | | | |
|---|---|---|---|
| 6,198,616 | B1 | 3/2001 | Dahimene et al. |
| 2003/0090070 | A1 | 5/2003 | Endou et al. |
| 2005/0041364 | A1 | 2/2005 | Kellerman et al. |
| 2008/0180873 | A1* | 7/2008 | Boyd .......... H01L 21/6833 361/234 |
| 2009/0002913 | A1 | 1/2009 | Naim |
| 2009/0114158 | A1 | 5/2009 | Zucker et al. |
| 2014/0263176 | A1 | 9/2014 | Parkhe et al. |
| 2015/0138687 | A1* | 5/2015 | Boyd, Jr. .......... H01L 21/67288 361/234 |
| 2015/0187626 | A1 | 7/2015 | Parkhe et al. |
| 2015/0219479 | A1 | 8/2015 | Adderly et al. |
| 2015/0371851 | A1* | 12/2015 | Lee .................. H01L 21/02115 438/694 |
| 2016/0116518 | A1* | 4/2016 | Wang ................ G01R 29/24 324/457 |
| 2016/0300713 | A1 | 10/2016 | Cui et al. |

FOREIGN PATENT DOCUMENTS

| | | |
|---|---|---|
| JP | 2016139650 A | 8/2016 |
| WO | 1997037382 A1 | 10/1997 |

OTHER PUBLICATIONS

Gopalan et al.—U.S. Appl. No. 62/780,698, filed Dec. 17, 2018, entitled "Wireless In-Situ Real-Time Measurement of Electrostatic Chucking Force in Semiconductor Water Processing.".

JP Office Action dated Feb. 16, 2021 for Application No. 2020-508384.

Japanese Office Action for Application No. 2020-508384 dated Feb. 16, 2021.

* cited by examiner

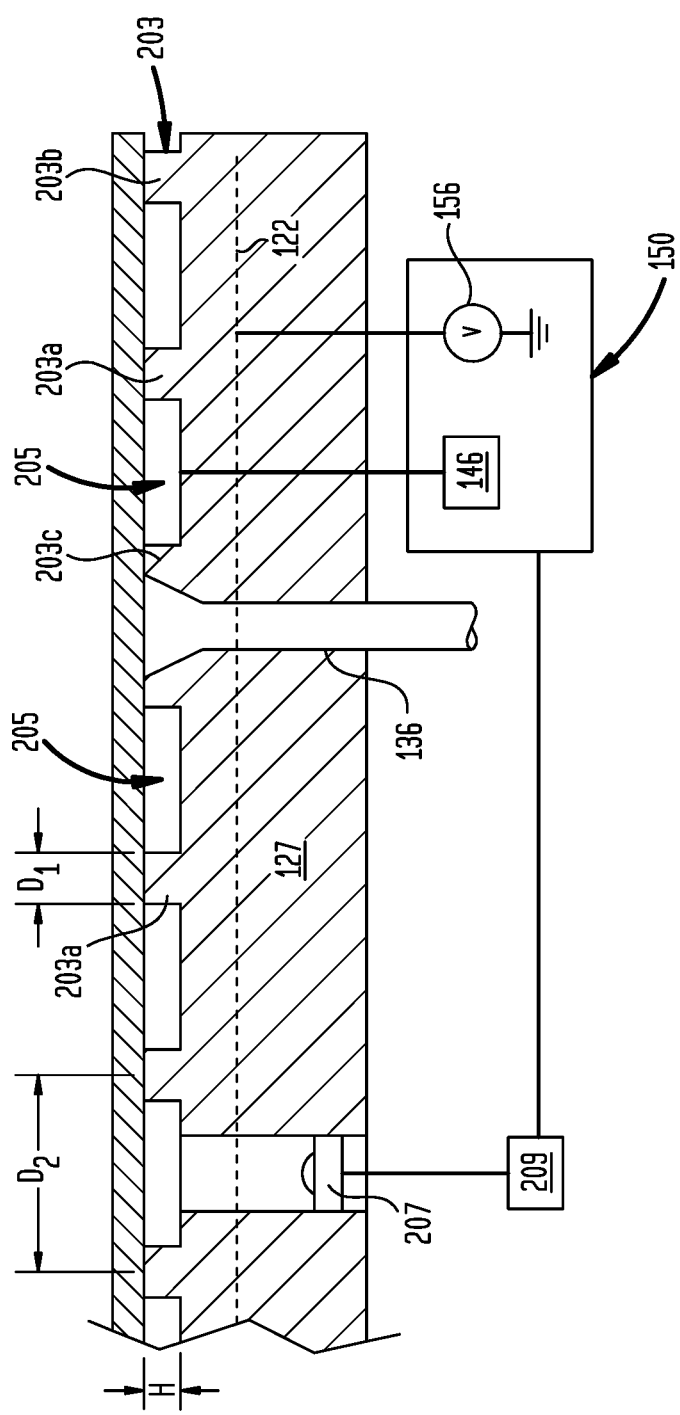

SUBSTRATE CHUCKING AND DECHUCKING METHODS

CROSS-REFERENCE TO RELATED APPLICATIONS

This application in a continuation-in-part of U.S. patent application Ser. No. 15/811,352, filed on Nov. 13, 2017, which claims priority to U.S. Provisional Application Ser. No. 62/556,147, filed on Sep. 8, 2017, both of which are herein incorporated by reference in its entirety.

BACKGROUND

Field

Embodiments described herein generally relate to semiconductor device manufacturing, in particular, to methods of chucking and de-chucking a substrate to and from a substrate support disposed in a processing chamber.

Description of the Related Art

Electrostatic chucking (ESC) substrate supports are commonly used in semiconductor device manufacturing to securely hold a substrate in a processing position, within a processing volume of a processing chamber, by means of an electrostatic chucking (ESC) force. The chucking force is a function of the potential between a DC voltage provided to a chucking electrode embedded in a dielectric material of the substrate support and a substrate disposed on a surface of the dielectric material.

Often, the substrate support is used to maintain the substrate at a desired temperature, or within a desired range of temperatures, through heat transfer between the dielectric material of the substrate support and the substrate disposed thereon. For example, some substrate supports comprise a heating element disposed in the dielectric material thereof that is used to heat the substrate support, and thereby the substrate, to a desired temperature before processing and/or to maintain the substrate at a desired temperature during processing. For other semiconductor manufacturing processes, it is desirable to cool the substrate during the processing thereof and the substrate support is thermally coupled to a cooling base, typically comprising one or more cooling channels having a cooling fluid flowing therethrough, that is used to cool the cooling base and thereby the substrate support, and thereby the substrate, disposed thereon.

Typically, a low pressure atmosphere in a processing volume of a processing chamber results poor thermal conduction between the dielectric material of the substrate support and the substrate thereby reducing the substrate support's effectiveness in heating or cooling the substrate. Therefore, in some processes, a thermally conductive inert gas, such as helium, is introduced into a backside volume disposed between a non-active surface of the substrate and the substrate support to improve heat transfer therebetween. The higher pressure of the backside volume (backside pressure), when compared to the pressure in the processing volume (processing pressure), exerts a backside force on the substrate that is opposite of the chucking force exerted by the chucking electrode. The difference between the chucking force and the backside force comprises the contact force between the substrate and the substrate support surface.

Unfortunately, excessive contact force between the substrate and the substrate support surface results in undesirable scratches on the non-active surface of the substrate facing the dielectric material of the substrate support and/or undesirable wear of the dielectric material of the substrate support. Particulate materials produced from the scratches and/or wear of the substrate support may eventually transfer from the substrate support and/or the non-active surface of the substrate to an active surface of the substrate and/or other substrates through subsequent handling and/or processing operations thereby ultimately suppressing device yield from a substrate.

Accordingly, what is needed in the art are improved electrostatic chucking and de-chucking methods.

SUMMARY

Embodiments described herein generally relate to plasma assisted or plasma enhanced processing methods. More specifically, embodiments described herein relate to electrostatic chucking (ESC) and de-chucking methods to reduce substrate scratches and defects related to electrostatic chucking before, during, and after plasma assisted or plasma enhanced semiconductor manufacturing processes.

In one embodiment a method for chucking a substrate includes positioning the substrate on a substrate support disposed in a processing volume of a processing chamber. The method further includes forming a plasma in the processing volume and chucking the substrate to the substrate support. Chucking the substrate to the substrate support includes applying a first chucking voltage to a chucking electrode disposed in the substrate support to exert a chucking force on the substrate, flowing a gas comprising helium into a backside volume disposed between the substrate and the substrate support, and increasing the chucking voltage from the first chucking voltage to a second chucking voltage while simultaneously increasing a backside pressure in the backside volume from a first backside pressure to a second backside pressure. Here, one or both of the first chucking voltage and the second chucking voltage are determined by a method which comprises positioning a contact force measurement substrate on the substrate support, forming a plasma in the processing volume, chucking the contact force measurement substrate to the substrate support, and measuring a contact force between the contact force measurement substrate and the substrate support.

In another embodiment a computer readable medium having instructions stored thereon for a method of processing a substrate is provided. The method positioning the substrate on a substrate support disposed in a processing volume of a processing chamber. The method further includes forming a plasma in the processing volume and chucking the substrate to the substrate support. Chucking the substrate to the substrate support includes applying a first chucking voltage to a chucking electrode disposed in the substrate support to exert a chucking force on the substrate, flowing a gas comprising helium into a backside volume disposed between the substrate and the substrate support, and increasing the chucking voltage from the first chucking voltage to a second chucking voltage while simultaneously increasing a backside pressure in the backside volume from a first backside pressure to a second backside pressure. Here, one or both of the first chucking voltage and the second chucking voltage are determined by a method which comprises positioning a contact force measurement substrate on the substrate support, forming a plasma in the processing volume, chucking the contact force measurement substrate to the substrate support, and measuring a contact force between the contact force measurement substrate and the substrate support.

In another embodiment, a substrate chucking method includes forming a plasma in a processing volume of a processing chamber and applying a chucking voltage to a chucking electrode embedded in a dielectric material of a substrate support disposed in the processing volume, the substrate support having a substrate disposed thereon. The chucking voltage applied to the chucking electrode is determined by a method which includes positioning a contact force measurement substrate on the substrate support, forming a plasma in the processing volume, measuring a contact force between the contact force measurement substrate and the substrate support, and determining a chucking force correction factor for the substrate support.

Benefits of the embodiments described herein include significant reductions in the contract force between the substrate and the substrate support during chucking and de-chucking. Reducing the contact force reduces the number and size of undesirable scratches on the non-active surface of the substrate and reduces wear of the substrate support surface, which, in turn reduces particulate material that would otherwise eventually contaminate the active surface or the substrate or other substrates to suppress the device yield thereof.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 2 is a close up sectional view of a portion of the substrate support used in the processing chamber of FIG. 1.

DETAILED DESCRIPTION

Figure 1:
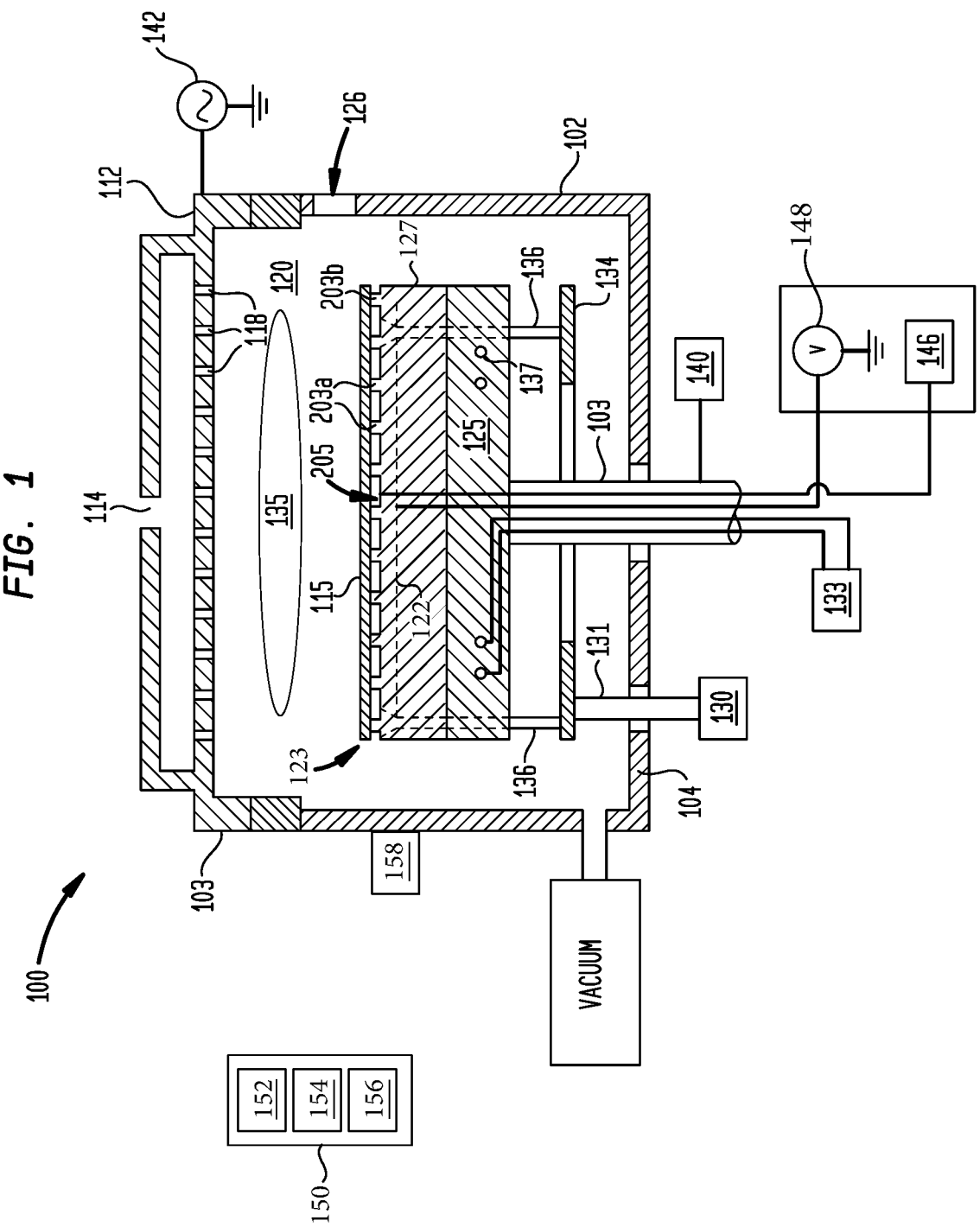
FIG. 1 is a schematic sectional view of a processing chamber used to practice the methods set forth herein, according to one embodiment.

Embodiments described herein generally relate to plasma assisted or plasma enhanced processing methods. More specifically, embodiments described herein relate to electrostatic chucking (ESC) methods to reduce substrate scratches and defects related to electrostatic chucking during plasma assisted or plasma enhanced semiconductor device manufacturing processes.

Typically, a low pressure atmosphere or environment maintained in a processing volume of a plasma processing chamber results in poor thermal conduction between a substrate and the dielectric material of an ESC substrate support that the substrate is disposed on during processing. To improve heat transfer between the substrate and the ESC substrate support, a thermally conductive inert gas, such as helium, is introduced into a substrate backside volume disposed between the substrate and the substrate support so that the pressure of the gas in this backside volume exceeds the gas pressure of the processing volume. Thus, the chucking force applied to the substrate by the chucking electrode must exceed the force exerted on the substrate by the gas in the backside volume to prevent the substrate from moving on the chuck. The difference between the chucking force pulling the substrate towards the substrate support and the backside force (the force exerted on the substrate by the gas in the backside volume) pushing the substrate away from the substrate support yields the contact force between the substrate and the substrate support surfaces in direct contact therewith.

Often, undesirable scratching of the substrate by the substrate support results when the contact force between the substrate and the substrate support significantly exceeds the minimum contact force required to securely hold the substrate in position for the processing thereof. Material produced from the scratches, which become loose particles on the non-active, substrate support facing, surface of the substrate and on the substrate support, and may eventually transfer to the active surface of the substrate or another substrate during handling or subsequent processing thereof. This increased defectivity on the active surface of the substrate negatively impacts the device yield thereof.

Typically, the maximum applied contact force between the substrate and the substrate support surfaces is determined by the substrate chucking and de-chucking method used and substrate support to substrate support chucking force variability for a given chucking voltage. Conventional chucking methods typically apply a chucking voltage to the chucking electrode before pressurizing of the backside volume enabled by flowing a gas thereinto. Conventional de-chucking methods typically depressurize the backside volume before releasing the substrate from the substrate support by terminating the chucking voltage applied to the chucking electrode to allow backside gas to escape the backside volume and equalize pressure on either side surface of the substrate. Therefore, the contact forces between the substrate and the substrate support surfaces in direct contact therewith are typically highest during conventional chucking and de-chucking steps and significantly and undesirably exceed the minimum contact forces required to securely hold the substrate to the substrate support.

Further, manufacturing variability from substrate support to substrate support or variations within the useful lifetime of a substrate support often cause variations in the chucking force realized from a given chucking voltage. Thus, the minimum chucking voltage needed to secure a substrate to the substrate support may change from processing chamber to processing chamber (each having different substrate supports disposed therein) and may also change over the useful lifetime of the substrate support.

Therefore, the methods herein provide for simultaneous ramping of a chucking voltage provided to a chucking electrode disposed in the substrate support and the pressure of gas in the backside volume disposed between the substrate and the substrate support. In some embodiments, the chucking voltages used with the chucking and de-chucking methods are determined and/or adjusted using a chucking force correction factor specific to the substrate support being used which is determined by a chucking force measurement method provided herein.

FIG. 1 is a schematic sectional view of a processing chamber 100 used to practice the methods described herein, according to one embodiment. Typically, the processing chamber 100 is a plasma processing chamber, such as a plasma etch chamber, a plasma-enhanced deposition chamber, for example a plasma-enhanced chemical vapor deposition (PECVD) chamber or a plasma-enhanced atomic layer deposition (PEALD) chamber, or a plasma based ion implant chamber, for example a plasma doping (PLAD) chamber. The processing chamber described in FIG. 1 features a capacitively coupled plasma (CCP) source, such as a plasma electrode disposed in the processing volume where the plasma electrode is electrically coupled to an RF power supply and capacitively couples energy and power into the plasma in the chamber. In other embodiments, the processing chamber may feature an inductively coupled plasma (ICP) source electrically coupled to an (RF) power supply.

However, the methods described herein can be used with any processing chamber using an ESC substrate support where gas is provided to a volume present between the ESC substrate support and a substrate disposed thereon.

Herein, the processing chamber 100 described is a schematic representation of a CVD processing chamber, and it includes a chamber lid 103, one or more sidewalls 102, and a chamber base 104 which collectively define a processing volume 120. A showerhead 112, having a plurality of openings 118 disposed therethrough, is disposed in the chamber lid 103 and is used to uniformly distribute processing gases from a gas inlet 114 into the processing volume 120. The showerhead 112 is coupled to a first power supply 142, such as an RF or VHF power supply, which ignites and maintains a processing plasma 135 composed of the processing gases through capacitive coupling therewith. The processing volume 120 is fluidly coupled to a vacuum, such as to one or more dedicated vacuum pumps, which maintains the processing volume 120 at sub-atmospheric conditions and evacuates processing and other gases therefrom. A substrate support assembly 123, disposed in the processing volume 120 is disposed on a support shaft 124 sealingly extending through the chamber base 104. The support shaft 124 is coupled to an actuator 140 that raises and lowers the support shaft 124, and the substrate support assembly 160 disposed thereon, to facilitate processing of the substrate 115 in the processing chamber 100.

The substrate 115 is loaded into the processing volume 120 through an opening 126 in one of the one or more sidewalls 102, which is conventionally sealed with a or door or a valve (not shown) during substrate 115 processing. A plurality of lift pins 136 disposed above, but engageable with, a lift pin hoop 134 are movably disposed through the substrate support assembly 160 to facilitate transferring of the substrate 115 thereto and therefrom. The lift pin hoop 134 is coupled to lift hoop shaft 131 sealingly extending through the chamber bottom, which raises and lowers the lift pin hoop 134 by means of an actuator 130. When the lift pin hoop 134 is in a raised position, the plurality of lift pins 136 are contacted from below and moved to extend above the surface of the substrate support 127 lifting the substrate 115 therefrom and enabling access to the substrate 115 by a robot handler. When the lift pin hoop 134 is in a lowered position the tops of the plurality of lift pins 136 are flush with, or below, the substrate support surface 203 and the substrate rests on a plurality of protrusions 203a thereof.

Typically, the substrate support assembly 123 includes a cooling base 125 and a substrate support 127 thermally coupled to, and disposed on, the cooling base 125. The cooling base 125 is used to regulate the temperature of the substrate support 127, and the substrate 115 disposed on the substrate support, during processing. The cooling base 125 includes one or more fluid conduits 137 disposed therein that are fluidly coupled to, and in fluid communication with, a coolant source 133, such as a refrigerant source or water source. Typically, the cooling base 125 is formed of a corrosion resistant thermally conductive material, such as a corrosion resistant metal, for example aluminum, an aluminum alloy, or stainless steel, and is thermally coupled to the substrate support 127 with an adhesive or by mechanical means.

Operation of the processing chamber 100, including the substrate chucking and de-chucking operations thereof is facilitated by a system controller 150. Here, the system controller 150 includes a programmable central processing unit, here the CPU 152, that is operable with a memory 154 (e.g., non-volatile memory) and support circuits 156. The support circuits 156 are conventionally coupled to the CPU 152 and comprise cache, clock circuits, input/output subsystems, power supplies, and the like, and combinations thereof coupled to the various components of the processing chamber, to facilitate control thereof. The CPU 152 is one of any form of general purpose computer processor used in an industrial setting, such as a programmable logic controller (PLC), for controlling various components and sub-processors of the processing chamber 100. The memory 154, coupled to the CPU 152, is non-transitory and is typically one or more of readily available memories such as random access memory (RAM), read only memory (ROM), floppy disk drive, hard disk, or any other form of digital storage, local or remote.

Typically, the memory 154 is in the form of a computer-readable storage media containing instructions (e.g., non-volatile memory), that when executed by the CPU 152, facilitate the operation of the processing chamber 100. The instructions in the memory 154 are in the form of a program product such as a program that implements the methods of the present disclosure. The program code may conform to any one of a number of different programming languages. In one example, the disclosure may be implemented as a program product stored on computer-readable storage media for use with a computer system. The program(s) of the program product define functions of the embodiments (including the methods described herein).

Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure. In some embodiments, the methods set forth herein, or portions thereof, are performed by one or more application specific integrated circuits (ASICs), field-programmable gate arrays (FPGAs), or other types of hardware implementations. In some other embodiments, the polishing pad manufacturing methods set forth herein are performed by a combination of software routines, ASIC(s), FPGAs and, or, other types of hardware implementations.

Figure 5:
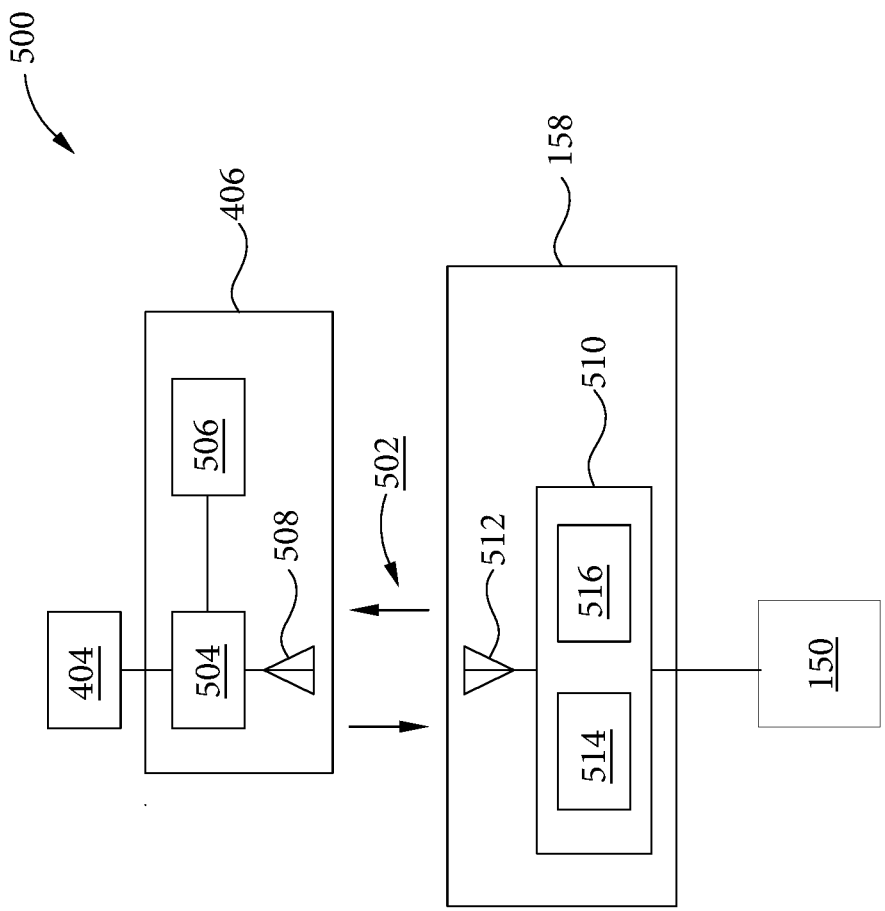
FIG. 5 schematically illustrates a communication system used to practice the methods set forth herein, according to one embodiment.
Figure 6:
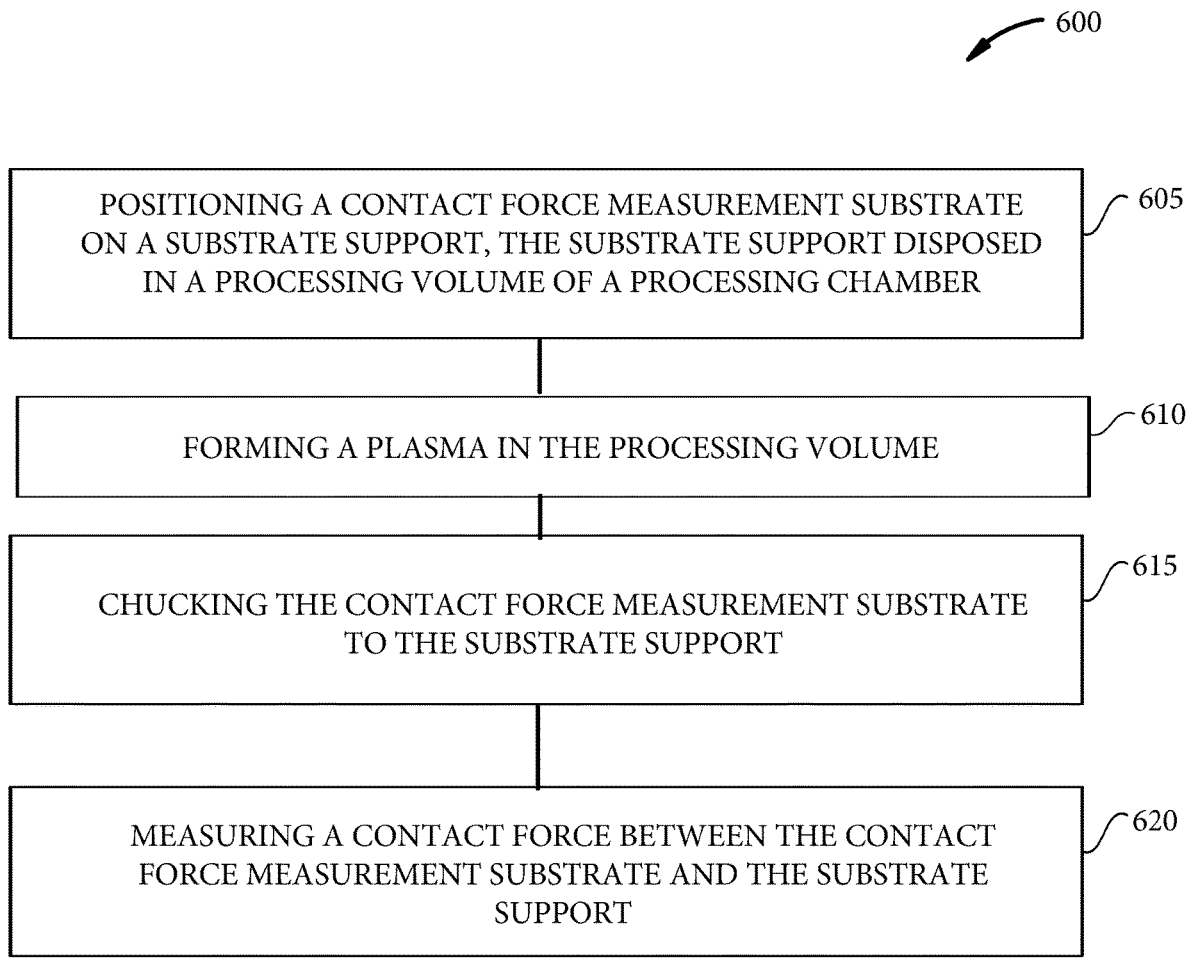
FIG. 6 is a flow diagram setting forth a method of determining a chucking force correction factor for a substrate support, according to one embodiment.

In some embodiments, processing chamber 100 further includes a wireless communication device, such as the interrogator 158, which may be used with the method set forth in FIG. 6 to determine a chucking force correction factor. The interrogator 158 is further described in FIG. 5.

FIG. 2 is a close up sectional view of a portion of the substrate support 127 shown in FIG. 1. The substrate support 127 is formed from a dielectric material, such as a ceramic material, such as a metal oxide or metal nitride ceramic material, for example $Al_2O_3$, AlN, $Y_2O_3$, mixtures thereof, and combinations thereof. The substrate support 127 includes a chucking electrode 122, embedded in the dielectric material thereof, planarly disposed parallel to the substrate support surface 203. The chucking electrode 122 is used to secure the substrate 115 to the substrate support 127 by providing a potential between the substrate 115 and the chucking electrode 122. The potential between the substrate 115 and the one or more chucking electrodes 122 results in an electrostatic chucking (ESC) attraction force therebetween. When disposed in a processing volume of a processing chamber, such as shown in FIG. 1, the chucking electrode 122 is electrically coupled to a chucking power supply 148, such as a DC power supply, which provides a chucking voltage thereto between about −5000 V and about +5000.

Here, the substrate support surface 203 further includes a plurality of protrusions 203a, a sealing lip 203b, a plurality of lift pin opening lips 203c, and one or more recessed surfaces 203d that define a backside volume 205 when the substrate 115 is chucked to the substrate support 127. The plurality of protrusions 203a herein include a plurality of cylindrical shaped mesas having a diameter $D_1$ of between about 500 μm and about 5 mm. The plurality of protrusions 203a are spaced apart from one another by a center to center (CTC) spacing $D_2$ of between about 5 mm and about 20 mm. The sealing lip 203b is concentrically disposed on the substrate support 127 and is proximate to the outer circumference thereof. Each of the plurality of lift pin opening lips 203c comprise an annular ring coaxially disposed about a respective lift pin opening formed in the dielectric material of the substrate support 127. The plurality of protrusions 203a, the sealing lip 203b, and the lift pin opening lips 203c extend above the recessed surface 203d by a height H of between about 3 um and about 700 um.

Typically, the plurality of protrusions 203a,c at least, hold the substrate 115 apart from the recessed surface 203d when the substrate 115 is chucked to the substrate support 127 which allows gas to flow therebetween. The sealing lip 203b and the lift pin opening lips 203c prevent gases from flowing between the processing volume 120 and the backside volume 205 when the substrate 115 is disposed thereon. An inert thermally conductive gas, such as helium, is provided to the backside volume 205 from a gas source 146. The inert gas thermally couples the substrate 115 to the substrate support surface 203 and increases the heat transfer therebetween. Typically, the gas pressure in the backside volume 205 is between about 1 Torr and about 100 Torr, such as between about 1 Torr and about 20 Torr, during plasma processing of the substrate 115. In some embodiments, the substrate support 127 further includes one or more sensors 207 that measure a deflection of the substrate 115 when a chucking voltage is applied thereto. The deflection of the substrate 115 is communicated to a controller 209 which determines the contact force between the substrate 115 and the substrate support 127 and adjusts the chucking voltage accordingly.

Figure 3A:
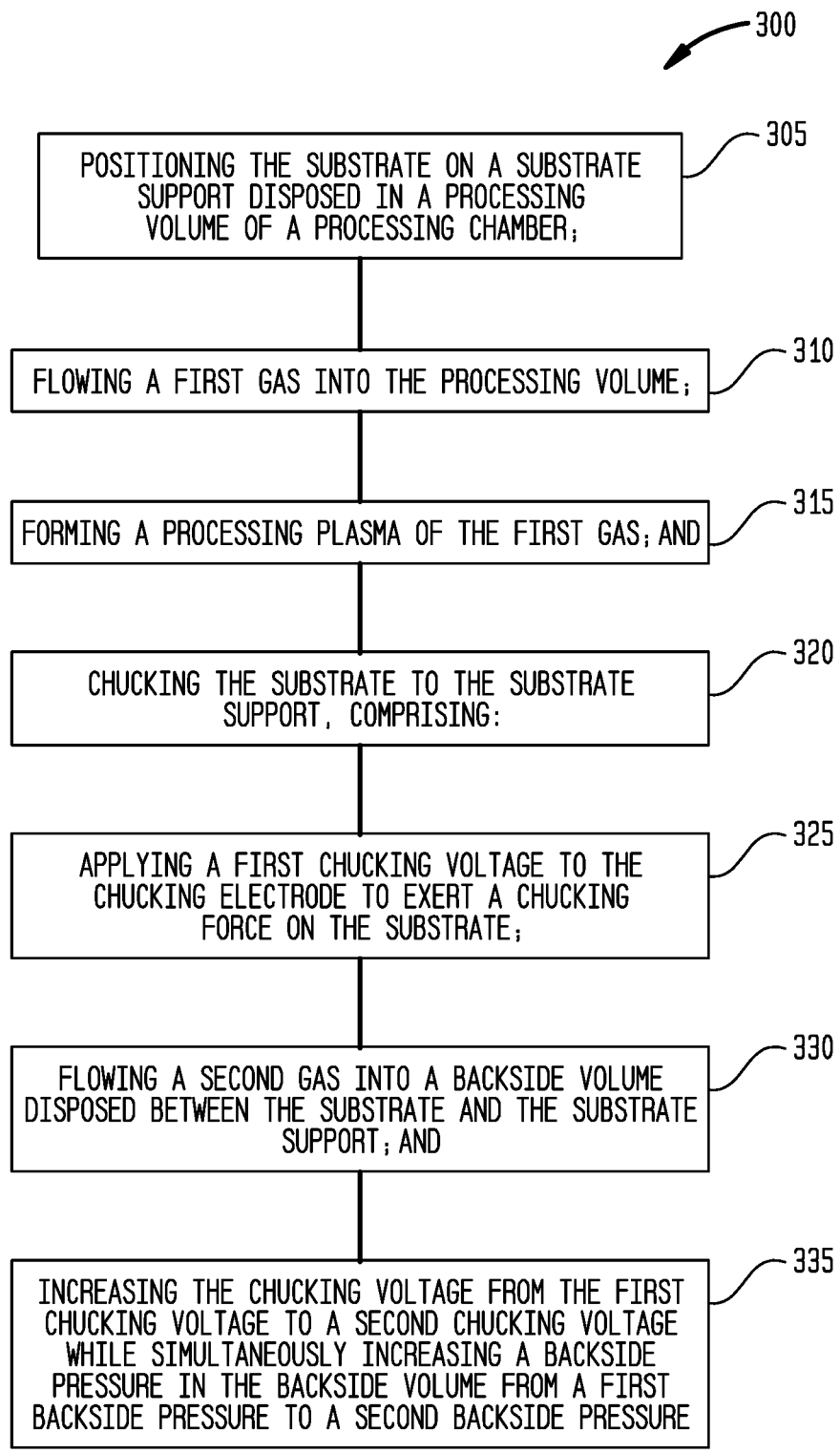
FIG. 3A is a flow diagram setting forth a method for chucking a substrate to a substrate support, according to one embodiment.
Figure 3B:
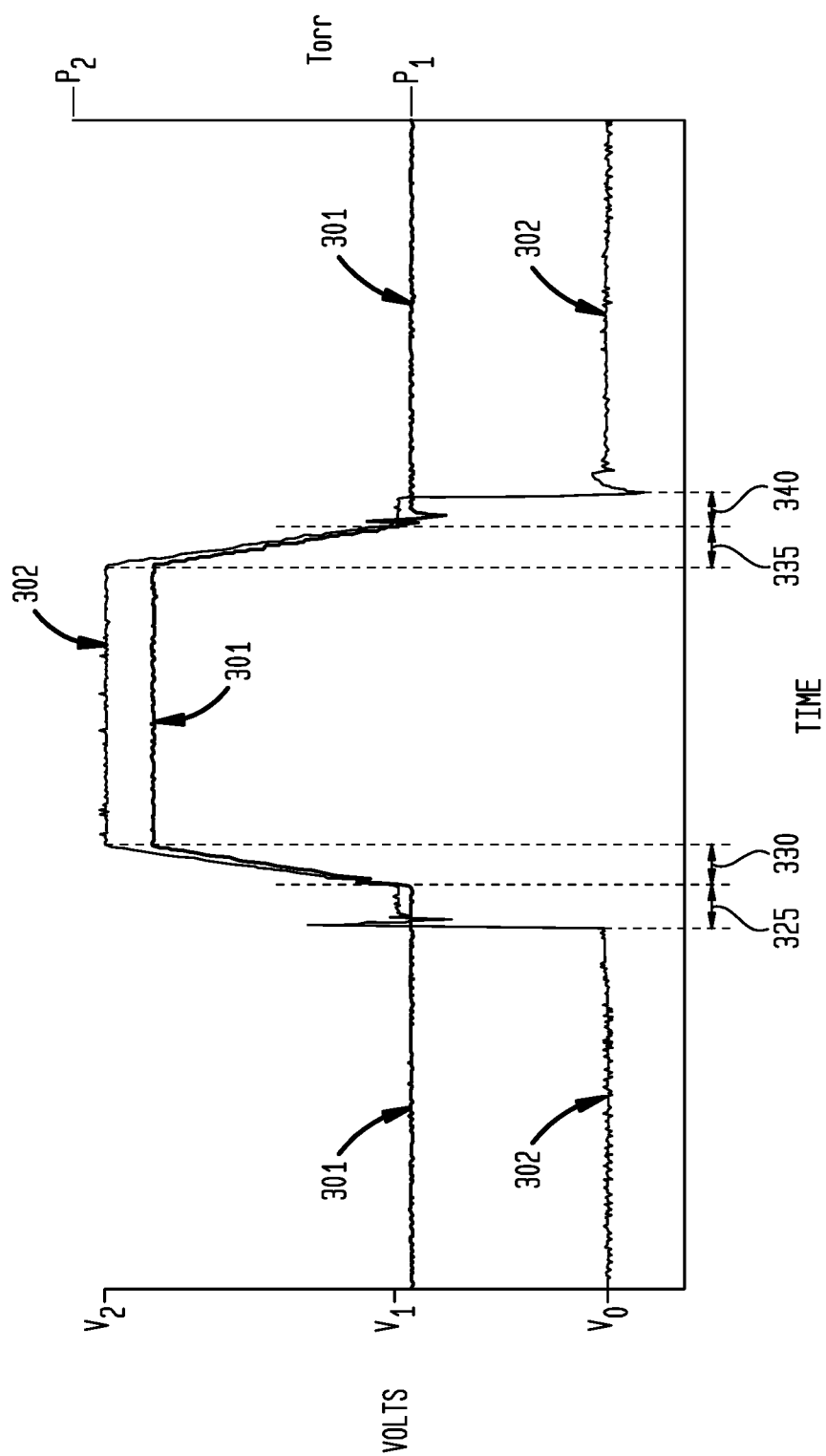
FIG. 3B shows the chucking voltage and backside volume pressure during application of the method described in FIG. 3A.

FIG. 3A is a flow diagram setting forth a method 300 of chucking a substrate to a substrate support, according to one embodiment. FIG. 3B shows the chucking voltage 301 and the backside volume pressure 302 during application of the method 300 described in FIG. 3A. The method 300 begins at activity 305 with positioning a substrate on a substrate support disposed in a processing volume of a processing chamber. Typically, the substrate support comprises a dielectric material having a recessed surface, a plurality of protrusions extending from the recessed surface, and a sealing lip extending from the recessed surface disposed proximate to an outer circumference of the substrate support. Herein, the substrate support further includes a plurality of lift pin opening lips extending from the recessed surface where each of the lift pin opening lips comprises an annular ring concentrically disposed about a respective lift pin opening formed in the dielectric material of the substrate support. The non-active surface of the substrate, the sealing lip, the lift pin opening lips, and the recessed surface define a backside volume disposed between the substrate and the recessed surface where the substrate is space apart from the recessed surface by the height of the plurality of protrusions that the substrate rests upon. The substrate support herein further includes a chucking electrode planarly disposed in the dielectric material of the substrate support and parallel to the recessed surface thereof.

The method 300 continues at activity 310 with flowing a first gas into the processing volume and at 315 with forming a plasma of the first gas.

The method 300 continues at activity 320 with chucking the substrate to the substrate support which comprises applying a first chucking voltage $V_1$ to the chucking electrode to exert a chucking force on the substrate at activity 325 of the method 300. Applying the first chucking voltage $V_1$ to the chucking electrode pulls the substrate into uniform contact with the sealing lip and the plurality of lift pin opening lips with enough force to fluidly isolate the backside volume from the processing volume of the processing chamber. After applying the first chucking voltage $V_1$ at activity 325 the method 300 continues at activity 330 with flowing a second gas, typically a thermally conductive inert gas such as helium, into the backside volume. The method 300 continues at activity 335 with increasing the first chucking voltage $V_1$ to a second chucking voltage $V_2$ while simultaneously increasing the pressure in the backside volume from a first backside pressure $P_1$ to a second backside pressure P2. In embodiments herein, the first chucking voltage $V_1$ is between about 100 V and about 1000 V and the second chucking voltage $V_2$ is between about the first voltage and about 3000 V, for example between about the first chucking voltage $V_1$ and about 2000 V. Typically, the pressures in the backside volume are between about 1 Torr and about 100 Torr, such as between about 1 Torr and about 20 Torr. Herein, the rate of voltage increase between the first chucking voltage and the second chucking voltage and the rate of pressure increase between the first pressure and the second pressure is substantially constant. The rate of voltage increase is between about 50 V/s and about 800 V/s and the rate of pressure increase is between about 0.1 Torr/s and about 20 Torr/s, such as between about 0.2 Torr/s and about 10 Torr/s.

In some embodiments, the method 300 further includes de-chucking the substrate from the substrate support by decreasing the backside pressure from the second backside pressure to a third backside pressure while simultaneously decreasing the second chucking voltage to a third chucking voltage. Typically, the third backside pressure is the same as the gas pressure in the processing volume and the third chucking voltage is about 0 V.

In some embodiments, processing of the substrate comprises applying a bias voltage to a bias electrode disposed in the substrate support. To attract ions of the plasma in the direction of the substrate on the substrate support. In those embodiments, applying the bias voltage begins after chucking of the substrate to the substrate support and ends before de-chucking of the substrate from the substrate support.

In some embodiments, the chucking voltages used in method 300 are adjusted using a chucking force correction factor to correct for substrate support chucking force variation or variation in chucking force across the useful lifetime of a substrate support. Apparatus and methods for determining a chucking force correction factor are provided in the description below and in FIGS. 4A-4B, 5, and 6.

Figure 4:
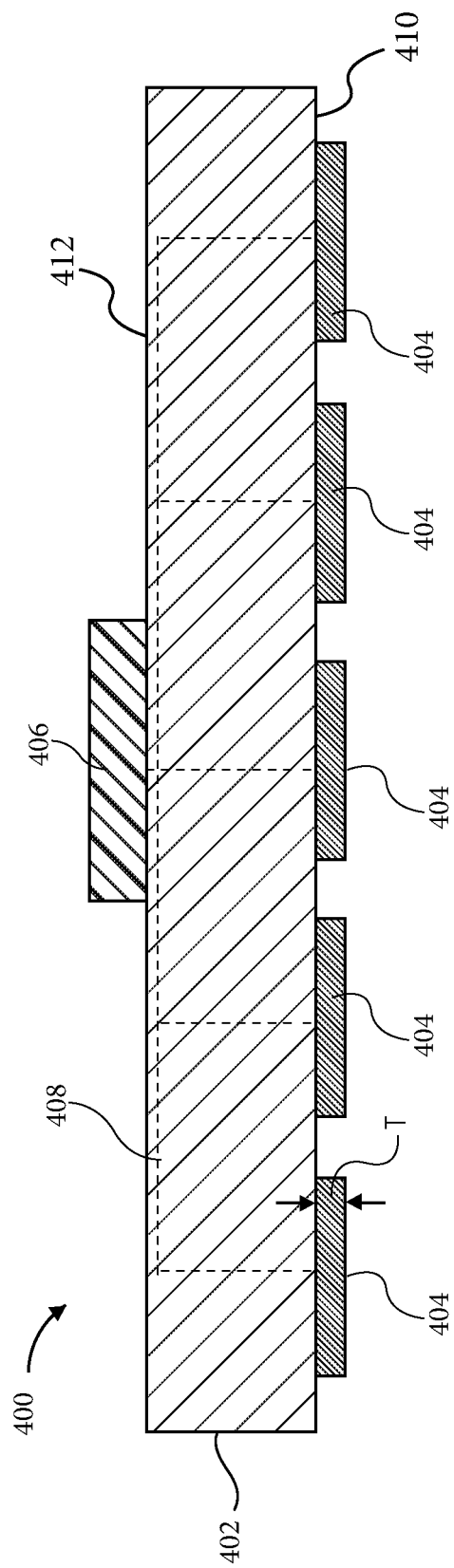
FIG. 4 is a schematic sectional view of a contact force measurement substrate which may be used to practice the methods set forth herein, according to one embodiment.

FIG. 4 is a schematic cross-sectional view of a contact force measurement substrate 400 which may be used to determine a chucking force correction factor for a substrate support, according to one embodiment. The contact force measurement substrate 400 features a substrate 402, a plurality of contact force sensors 404, a remote communication device 406, and communication links 408 therebetween. Typically, the substrate 402 is formed of the same or similar material, and has the same general shape and size, of a substrate used in the manufacturing of semiconductor devices and electrostatically chucked by the substrate support. For example, in some embodiments the substrate 402 is formed of a silicon wafer having a diameter of about 150 mm, 200 mm, 300 mm, or 450 mm and a thickness less than about 1 mm.

Here, the plurality of contact force sensors 404 are disposed on a first surface 410 of the substrate 402 and the remote communication device 406 is disposed on a second surface 412 of the substrate 402 which is opposite the first surface 410. The communication links 408 are disposed through the substrate 402 to communicatively couple the remote communication device 406 to individual ones of the plurality of contact force sensors 404. In other embodiments, the plurality of contact force sensors 404 are disposed in recessed openings formed in a first surface 410 so that the outwardly facing surfaces of the contact force sensors 404 are substantially coplanar therewith. In some other embodiments, the remote communication device 406 is disposed in a recessed opening formed in the second surface 412 of the substrate 402. In some embodiments, the communication links 408 include a plurality of first portions extending through the substrate 402 from the first surface 410 to the second surface 412 thereof, and each first part is connected to an individual one of the contact force sensors 404, and second portions extending along, or in trenches formed into, the second surface 412 from the location of a first portion exposed at the second surface 412 to the remote communication device 406. Furthermore, a protection layer such as a dielectric layer may overlie the second portions on the second surface 412. In one aspect, the communication links comprise copper deposited into openings in the substrate 402 from the first surface 410 to second surface 412 sides thereof, and on the second surface side 412.

The contact force sensors 404 are used to determine a chucking force applied between the substrate 402 and substrate support when the substrate 402 is chucked to a substrate support, such as the substrate support 127 described in FIGS. 1-2, by measuring the contact forces therebetween. Thus, the contact force sensors 404 may comprise any sensors suitable for measuring contact forces between the substrate 402 and the substrate contacting surfaces of a substrate support when a the substrate 402 is chucked thereto. Examples of suitable sensors include piezo-electric sensors, piezo-resistive sensors, micro-electro-mechanical (MEMS) sensors, such as MEMS load cells, and combinations thereof. In some embodiments, the contact force sensors 404 comprise thin film sensors having a thickness T of less than about 100 µm, less than about 50 µm, for example less than about 25 µm. A communication system which may be used with the contact force measurement substrate 400 and a method of using the contact force measurement substrate 400 to determine a chucking force correcting factor are described below in FIGS. 5 and 6 respectively.

FIG. 5 schematically illustrates a communication system 500, according to one embodiment, which may be used with the processing chamber 100 of FIG. 1 to practice the methods set forth herein. Here, each of the plurality of contact force sensors 404 (one shown) are communicatively coupled to the remote communication device 406 which receives information from the contact force sensor 404 and wirelessly communicates the information to an interrogator, such as the interrogator 158 of FIG. 1, via a wireless communication link 502. Typically, the remote communication device 406 includes a tag 504 communicatively coupled to the contact force sensor 404, memory 506, and an antenna 508 which is coupled to or integrally manufactured in the tag 504.

Here, the interrogator 158 includes a reader 510 and an antenna 512. The reader 510 includes and, or, is coupled to a power source (not shown), such as an RF power source, and is configured to transmit, via the antenna 512, an electromagnetic signal to be received by the remote communication device 406. Herein, the reader 510 includes an RF modulator 514 and an interrogator controller 516 configured to manage signal transmission and, or, reception to and, or, from the reader 510. Typically a frequency used for the wireless communication link 502 is selected to avoid interference from or cross talk with first power supply 142 of the processing chamber 100. For example, in one embodiment the wireless communication link 502 operates at a frequency of 2.4 GHz using a Bluetooth compatible communication protocol. The interrogator 158 is communicatively coupled to the controller 150 of the processing chamber 100 through a wired or wireless communication link. Contact force measurements are communicated from the contact force sensors 404 to the controller 150 using the communication system 500 and are processed by the controller 150 to determine a chucking force correction factor as further described in the method set forth in FIG. 6.

FIG. 6 is a flow diagram setting forth a method 600 of determining a chucking force correction factor for a given substrate support, according to one embodiment. At activity 605 the method 600 includes positioning a contact force measurement substrate on a substrate support. Typically, the contact force measurement substrate, such as the contact force measurement substrate 400 described in FIG. 4, features a one or more or a plurality of contact force sensors disposed on or in a first surface of a contact force measurement substrate. Individual ones of the contact force sensors are communicatively coupled to a remote communication device(s) disposed on or in a second surface of the substrate which is opposite of the first surface. Here, the contact force measurement substrate is positioned with the first surface facing the substrate support so that the contact force sensors are disposed adjacent thereto.

At activity 610 the method 600 includes forming a plasma in the processing volume of the process chamber within which the substrate support is disposed. Typically, forming the plasma comprises flowing a gas into the processing volume and igniting and maintaining a plasma of the gas using a plasma generator, such as a CCP or ICP plasma generator.

At activity 615 the method 600 includes chucking the contact force measurement substrate to the substrate support. Typically, chucking the contact force measurement substrate to the substrate support comprises applying a chucking voltage to a chucking electrode embedded in the substrate support.

At activity 620 the method 600 includes measuring a contact force, or a plurality of contact forces, between the contact force measurement substrate and the substrate support. Typically, the contact force measurement(s) are compared to the chucking voltage applied to the chucking electrode and are used to determine a chucking force correction factor specific to the substrate support. In some embodiments, the correction factor is the % difference between the contact force measurement(s) and a desired contact force for a standard chucking voltage. For example, in some embodiments the chucking force correction factor is determined by applying a standard chucking voltage and backside pressure, measuring the resulting contact force, and comparing the measured contact force to a desired contact force or expected contact force. In some embodiments, the standard chucking voltage and backside pressure is selected to be used with calibrating substrate supports across multiple processing chambers in a semiconductor device manufacturing facility. In some embodiments, the contact force is measured across a range of standardized chucking voltages and backside pressures to generate a linear or nonlinear chucking force correction equation. In some embodiments, the chucking force correction factor or equation is used to change a voltage application curve, specific to the processing chamber, such that the same backside gas ramp occurs and the final chucking voltage is achieved simultaneously therewith as shown and described in FIG. 3B.

The chucking force correction factor or equation(s) may be used to adjust for substrate support manufacturing variability or variations within the useful lifetime of a substrate support which cause variations in the chucking force realized from a given chucking voltage.

The method 600 may be used upon installation of a new or refurbished substrate support, after maintenance on the processing chamber, periodically based on the number of substrates processed on the substrate support, or various combinations thereof. In some embodiments, data compiled from one or more substrate supports across the useful lifetimes thereof is used to generate a predictive chucking force model and a chucking force correction factor or equation based on the number of substrate processed on a substrate support may be determined therefrom. Beneficially, the method 600 may be used with existing installations of substrate supports without modifications thereto.

The methods described herein may be used in part or in combination to provide for significant reductions in undesirable scratches to the non-active surface of a substrate compared to conventional methods by minimizing the contact force between the substrate and substrate support surfaces during chucking and de-chucking operations.

While the foregoing is directed to embodiments of the present disclosure, other and further embodiments of the disclosure may be devised without departing from the basic scope thereof, and the scope thereof is determined by the claims that follow.

The invention claimed is:

1. A method for chucking a substrate, comprising:
   positioning the substrate on a substrate support, wherein the substrate support is disposed in a processing volume of a processing chamber;
   forming a plasma in the processing volume; and
   chucking the substrate to the substrate support, comprising:
     applying a first chucking voltage to a chucking electrode disposed in the substrate support to exert a chucking force on the substrate;
     flowing a gas comprising helium into a backside volume disposed between the substrate and the substrate support; and
     increasing the chucking voltage from the first chucking voltage to a second chucking voltage while simultaneously increasing a backside pressure in the backside volume from a first backside pressure to a second backside pressure, wherein the one or both of the first chucking voltage and the second chucking voltage are determined by a method comprising:
       positioning a contact force measurement substrate on the substrate support, wherein the contact force measurement substrate comprises
         one or more contact force sensors selected from the group consisting of piezo-electric sensors, piezo-resistive sensors, micro-electro-mechanical sensors, and combinations thereof, and
         the one or more contact force sensors are disposed adjacent to the substrate support when the contact force measurement substrate is positioned thereon;
       forming a plasma in the processing volume;
       chucking the contact force measurement substrate to the substrate support by applying a chucking calibration voltage;
       determining a contact force between the contact force measurement substrate and the substrate support
       determining a chucking force correction factor, wherein the chucking force correction factor is a percent difference between the contact force determined using the contact force measurement substrate and a desired contact force at the chucking calibration voltage; and
       adjusting one or both of the first chucking voltage or the second chucking voltage using the chucking force correction factor.

2. The method of claim 1, further comprising de-chucking the substrate from the substrate support by decreasing the backside pressure from the second backside pressure to a third backside pressure while simultaneously decreasing the second chucking voltage to a third chucking voltage.

3. The method of claim 1, wherein the rate of voltage increase from the first chucking voltage to the second chucking voltage is substantially constant.

4. The method of claim 1, wherein applying the first chucking voltage to the chucking electrode fluidly isolates the backside volume from the processing volume.

5. The method of claim 1, wherein the second backside pressure is between about 1 Torr and about 100 Torr.

6. The method of claim 5, wherein the first chucking voltage is between about 100 V and about 1000 V, and wherein the second chucking voltage is between the first chucking voltage and about 2000 V.

7. The method of claim 1, wherein the contact force measurement substrate further comprises a remote communication device coupled to the one or more contact force sensors.

8. The method of claim 7, further comprising:
wirelessly communicating information received from the one or more contact force sensors to an interrogator disposed outside of the processing volume; and
determining a chucking force correction factor from the wirelessly communicated information.

9. A substrate chucking method, comprising:
forming a plasma in a processing volume of a processing chamber; and
applying a chucking voltage to a chucking electrode embedded in a dielectric material of a substrate support disposed in the processing volume, the substrate support having a substrate disposed thereon,
wherein the chucking voltage applied to the chucking electrode is determined by a method comprising:
positioning a contact force measurement substrate on the substrate support;
forming a plasma in the processing volume;
measuring a contact force between the contact force measurement substrate and the substrate support using one or more piezo-electric sensors disposed on the contact force measurement substrate; and
determining a chucking force correction factor, wherein the chucking force correction factor is a percent difference between the contact force determined using the contact force measurement substrate and a desired contact force at a chucking calibration voltage; and
adjusting one or both of a first chucking voltage or a second chucking voltage using the chucking force correction factor.

10. The method of claim 9, further comprising:
flowing a gas comprising helium into a backside volume disposed between the substrate and the substrate support; and
increasing the chucking voltage while simultaneously increasing a backside pressure in the backside volume.

11. The method of claim 9, wherein the contact force measurement substrate comprises a remote communication device communicatively coupled to the one or more contact force sensors.

12. The method of claim 11, wherein determining the chucking force correction factor for the substrate support comprises wirelessly communicating information received from the one or more contact force sensors to an interrogator disposed outside of the processing volume.

* * * * *